US012663484B2

(12) United States Patent
Ki

(10) Patent No.: US 12,663,484 B2
(45) Date of Patent: Jun. 23, 2026

(54) METHOD OF SETTING INFORMATION ABOUT BATTERY PACK AND BATTERY SYSTEM TO WHICH THE METHOD IS APPLIED

(71) Applicant: LG ENERGY SOLUTION, LTD., Seoul (KR)

(72) Inventor: Jeong Seok Ki, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 100 days.

(21) Appl. No.: 18/277,730

(22) PCT Filed: Oct. 7, 2022

(86) PCT No.: PCT/KR2022/015152
§ 371 (c)(1),
(2) Date: Aug. 17, 2023

(87) PCT Pub. No.: WO2023/068613
PCT Pub. Date: Apr. 27, 2023

(65) Prior Publication Data
US 2024/0133973 A1    Apr. 25, 2024
US 2024/0230785 A9    Jul. 11, 2024

(30) Foreign Application Priority Data

Oct. 20, 2021    (KR) ........................ 10-2021-0140157

(51) Int. Cl.
*G01R 31/396*        (2019.01)
*G01R 31/374*        (2019.01)
(Continued)

(52) U.S. Cl.
CPC ......... *G01R 31/396* (2019.01); *G01R 31/374* (2019.01); *G01R 31/3835* (2019.01);
(Continued)

(58) Field of Classification Search
CPC ................ G01R 31/396; G01R 31/374; G01R 31/3835; G01R 31/389; G01R 31/367;
(Continued)

(56) References Cited

U.S. PATENT DOCUMENTS 11,044,495 B1    6/2021 Dupont et al.
2003/0235754 A1* 12/2003 Maloizel .............. G01R 31/396
429/61
(Continued)

FOREIGN PATENT DOCUMENTS

CN        1967966 A      5/2007
CN        201893565 U    7/2011
(Continued)

OTHER PUBLICATIONS

International Search Report (PCT/ISA/210) issued in PCT/KR2022/015152 mailed on Jan. 13, 2023.
(Continued)

*Primary Examiner* — Huy Q Phan
*Assistant Examiner* — Haidong Zhang
(74) *Attorney, Agent, or Firm* — Birch, Stewart, Kolasch & Birch, LLP

(57) ABSTRACT

A method of setting information about a battery pack includes deriving, by a main control unit (MCU), information about a number of a plurality of battery cells based on a set resistance value connected to an input terminal of the MCU; when the derived number of the plurality of battery cells and a set maximum number N of cells are not the same, changing, by the MCU, a cell parameter indicating the number of battery cells from the maximum number of cells to the derived number of the plurality of battery cells; transmitting, by the MCU, a cell information request signal for requesting a number of cell voltages corresponding to the cell parameter to a battery monitoring integrated circuit (Continued)

(BMIC) connected to the plurality of battery cells; and receiving, by the MCU, a plurality of battery cell voltage signals from the BMIC.

20 Claims, 9 Drawing Sheets

(51) Int. Cl.

| | | |
|---|---|---|
| *G01R 31/3835* | (2019.01) | |
| *H01M 10/42* | (2006.01) | |
| *H01M 10/48* | (2006.01) | |

(52) U.S. Cl.
CPC ....... *H01M 10/425* (2013.01); *H01M 10/482* (2013.01); *H01M 10/486* (2013.01); *H01M 2010/4271* (2013.01)

(58) Field of Classification Search
CPC ... G01R 19/003; G01R 19/30; H01M 10/425; H01M 10/482; H01M 10/486; H01M 2010/4271; H01M 10/42; H01M 10/48; H04Q 9/00; Y02E 60/10
See application file for complete search history.

(56) References Cited

U.S. PATENT DOCUMENTS

| | | | | |
|---|---|---|---|---|
| 2007/0108941 | A1* | 5/2007 | Sainomoto | H02J 7/00302 |
| | | | | 320/112 |
| 2008/0036421 | A1* | 2/2008 | Seo | B60W 10/06 |
| | | | | 320/132 |
| 2008/0203976 | A1 | 8/2008 | Ooishi et al. | |
| 2009/0099799 | A1* | 4/2009 | Barsoukov | G01R 31/382 |
| | | | | 702/63 |
| 2009/0146610 | A1 | 6/2009 | Trigiani | |
| 2012/0139553 | A1* | 6/2012 | Nortman | H02J 9/002 |
| | | | | 324/126 |
| 2014/0028098 | A1 | 1/2014 | Trigiani | |
| 2014/0205865 | A1 | 7/2014 | Matsuo | |
| 2015/0355286 | A1* | 12/2015 | Kobayashi | H02J 7/0013 |
| | | | | 702/63 |
| 2016/0203197 | A1 | 7/2016 | Rastogi et al. | |
| 2018/0145519 | A1 | 5/2018 | Trigiani | |
| 2018/0149704 | A1 | 5/2018 | Yoon et al. | |
| 2018/0172769 | A1 | 6/2018 | Yoon et al. | |
| 2018/0248234 | A1 | 8/2018 | Okabe et al. | |
| 2019/0111800 | A1 | 4/2019 | Remboski et al. | |
| 2020/0153262 | A1 | 5/2020 | Yoon | |
| 2021/0143458 | A1 | 5/2021 | Yang | |
| 2022/0069371 | A1 | 3/2022 | Lee et al. | |
| 2022/0166239 | A1 | 5/2022 | Yoon | |

FOREIGN PATENT DOCUMENTS

| | | | |
|---|---|---|---|
| CN | 103941189 | A | 7/2014 |
| CN | 105556486 | A | 5/2016 |
| CN | 107490765 | A | 12/2017 |
| CN | 107710006 | A | 2/2018 |
| CN | 104734214 | B | 8/2018 |
| CN | 111448707 | A | 7/2020 |
| CN | 108463934 | B | 8/2021 |
| JP | 2007-143285 | A | 6/2007 |
| JP | 2008-215871 | A | 9/2008 |
| JP | 2018-519532 | A | 7/2018 |
| KR | 10-2010-0098550 | A | 9/2010 |
| KR | 10-1655089 | B1 | 9/2016 |
| KR | 10-2017-0060732 | A | 6/2017 |
| KR | 10-2017-0062328 | A | 6/2017 |
| KR | 10-2017-0069438 | A | 6/2017 |
| KR | 10-1945427 | B1 | 4/2019 |
| KR | 10-2005395 | B1 | 7/2019 |
| KR | 10-2035677 | B1 | 10/2019 |
| KR | 10-2092109 | B1 | 3/2020 |
| KR | 10-2021-0007246 | A | 1/2021 |
| KR | 10-2021-0036906 | A | 4/2021 |
| KR | 10-2021-0056122 | A | 5/2021 |

OTHER PUBLICATIONS

Anonomyous, Book ed. Design of Deshallower C Programming [M]. Guangzhou: Warth Technology University Press, Aug. 2021.

* cited by examiner

[Figure 1]
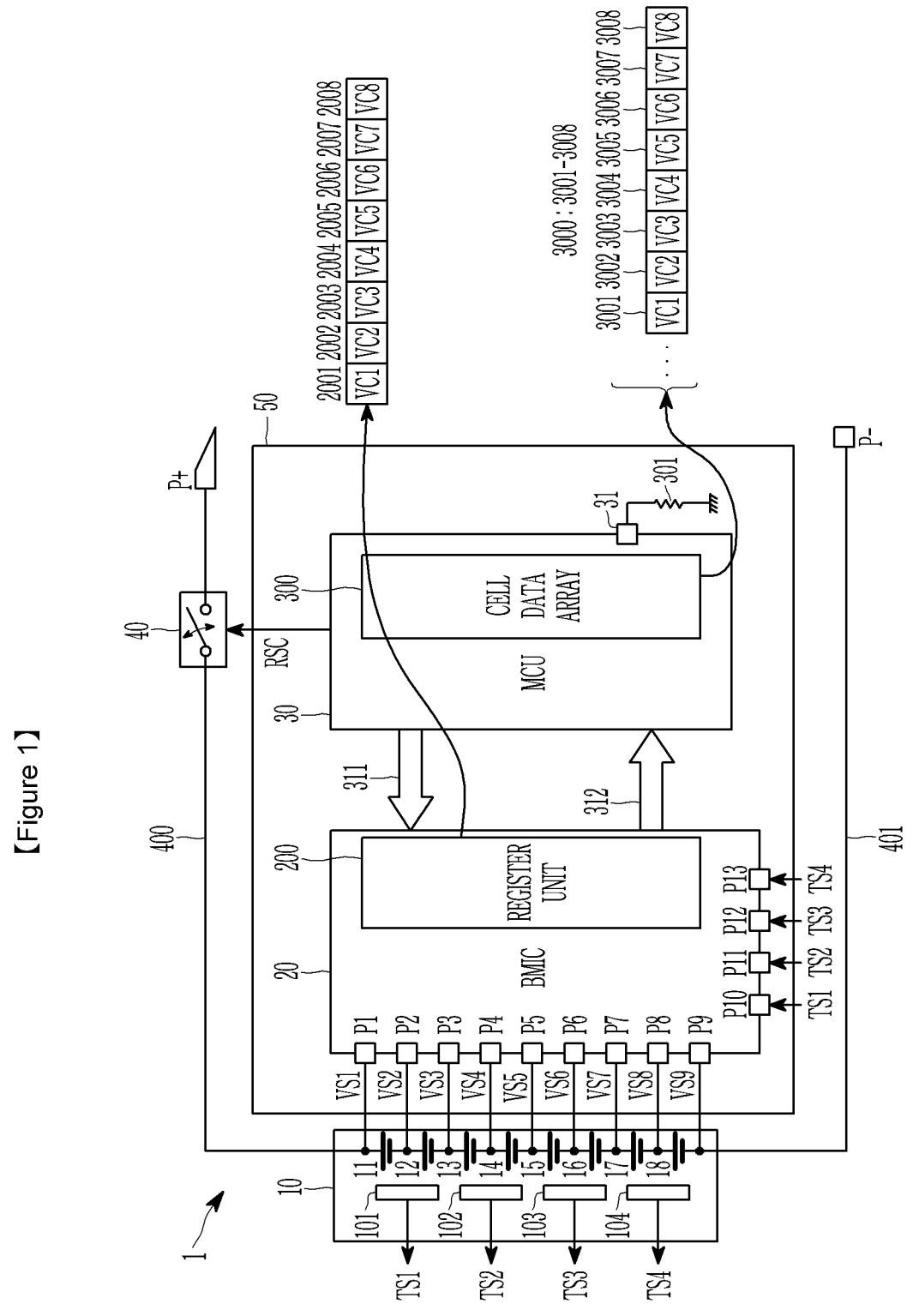

[Figure 2]
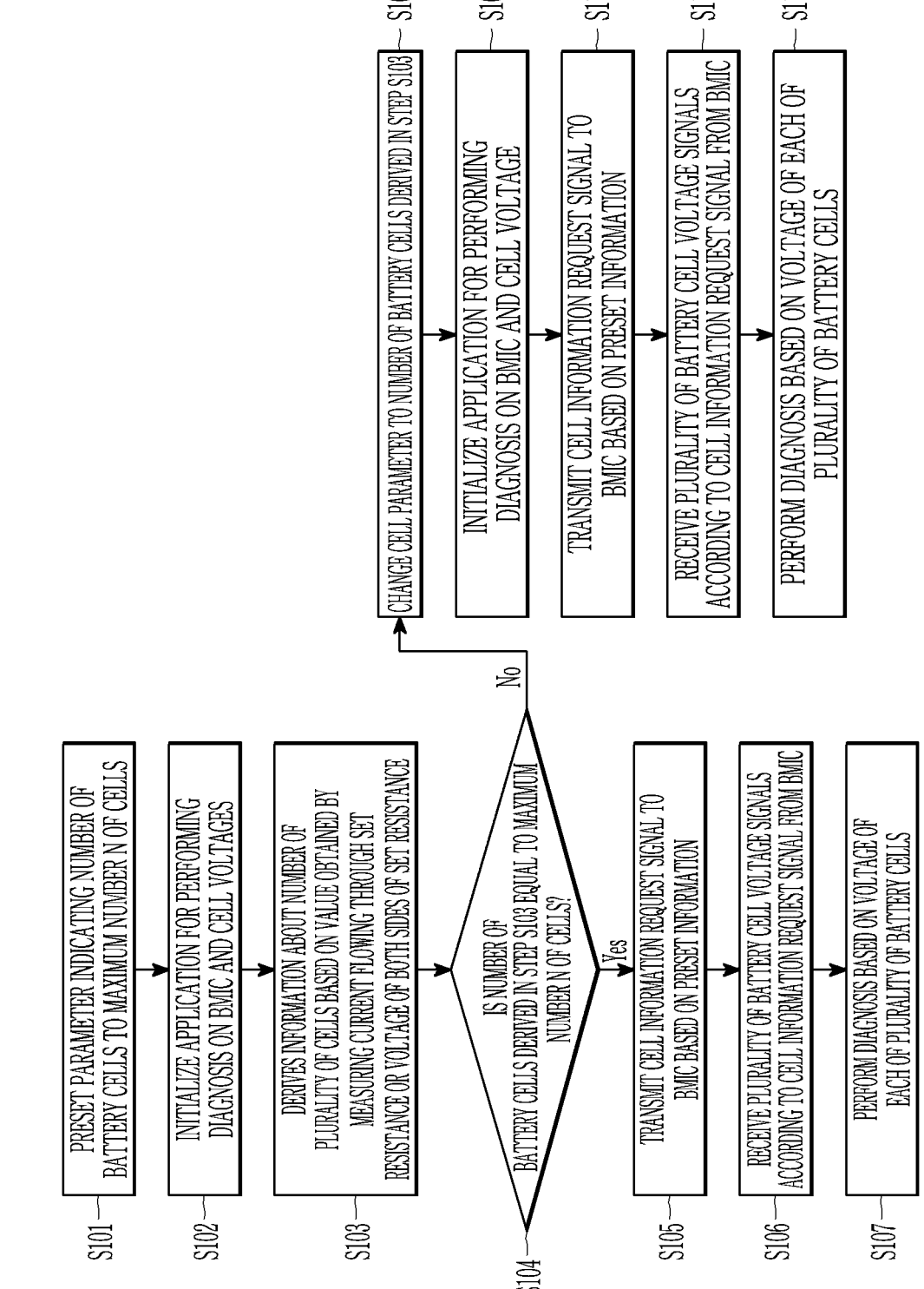

[Figure 3]
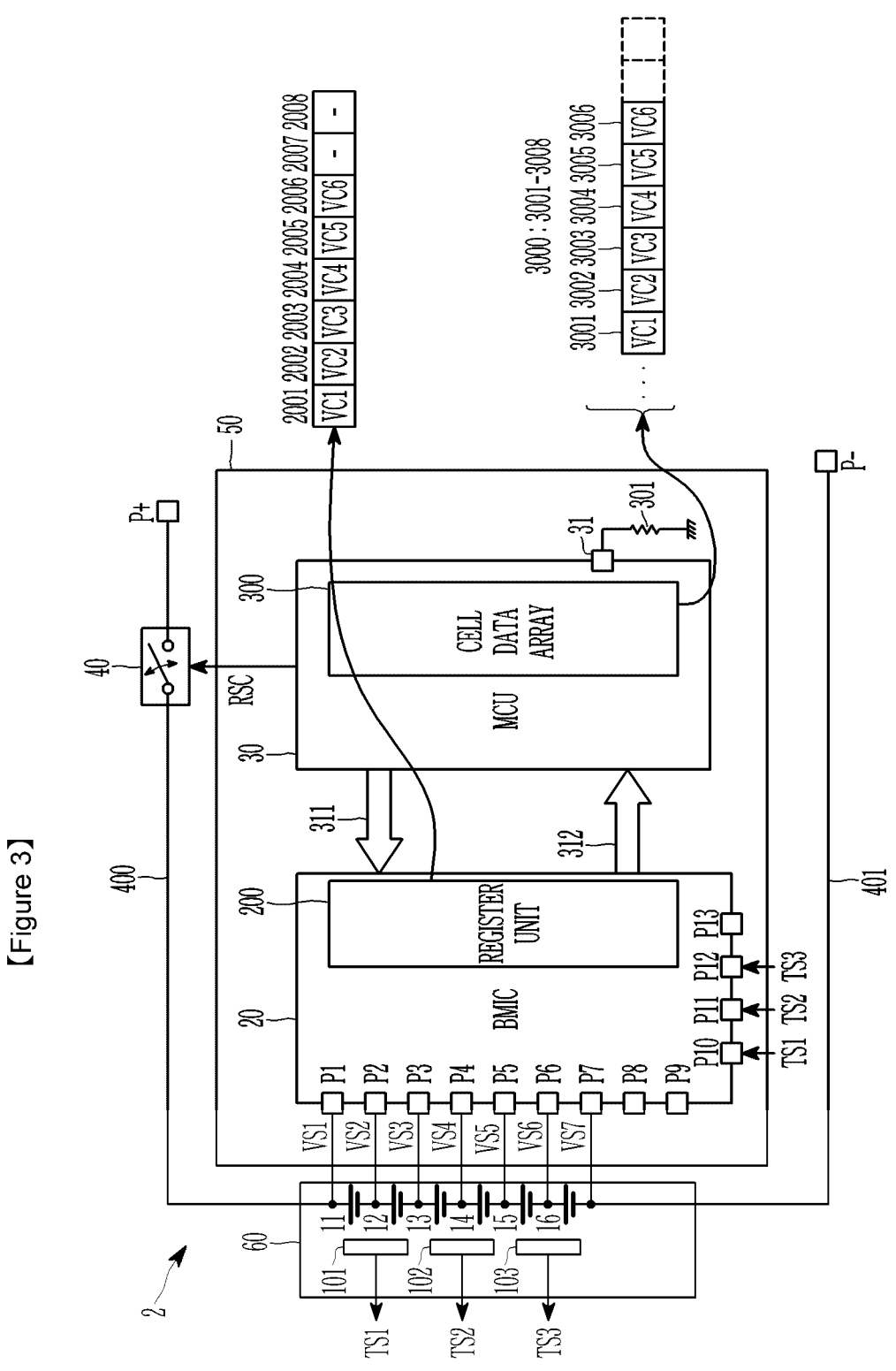

[Figure 4]
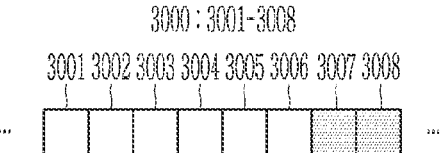

[Figure 5]
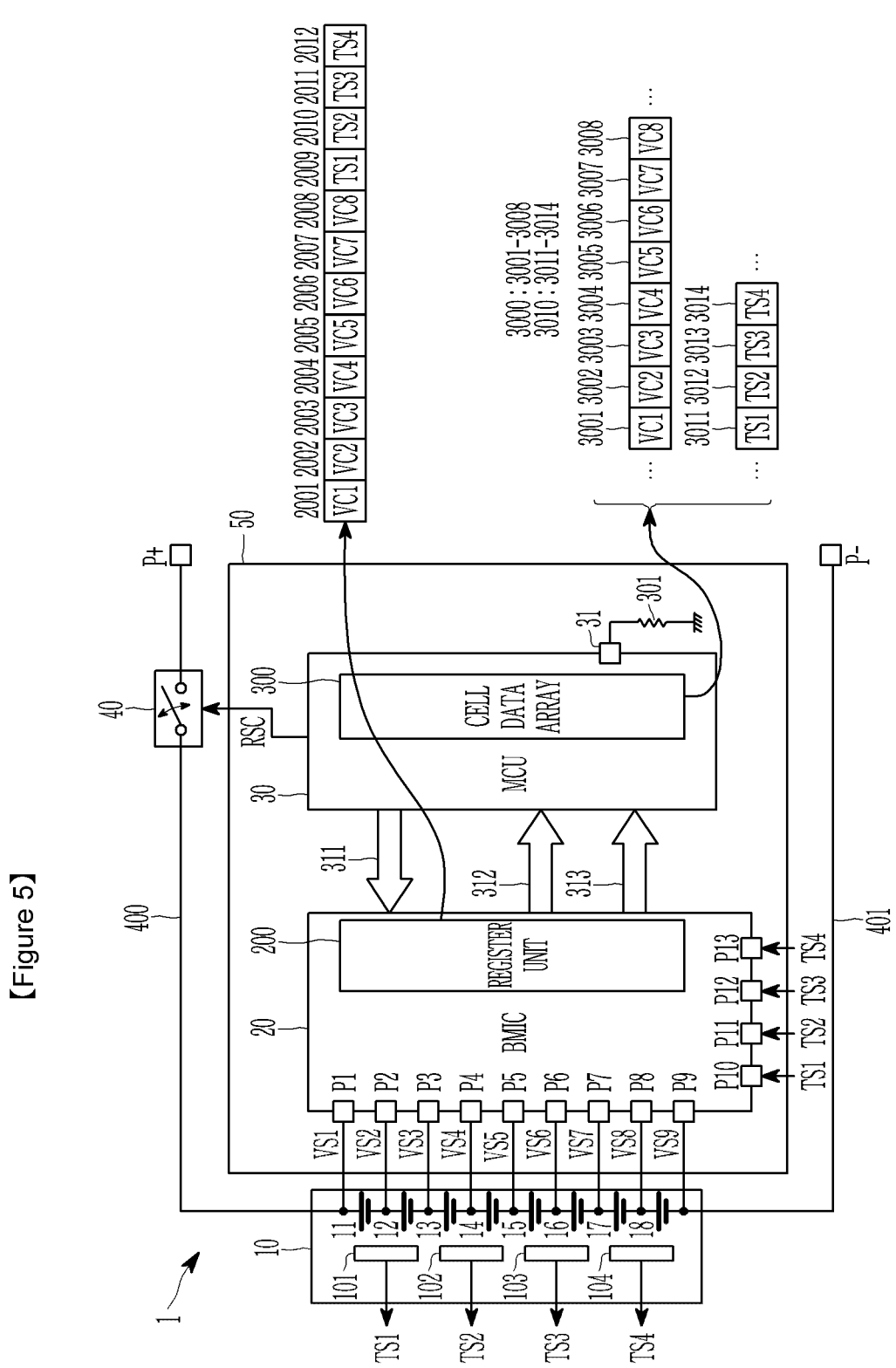

【Figure 6】

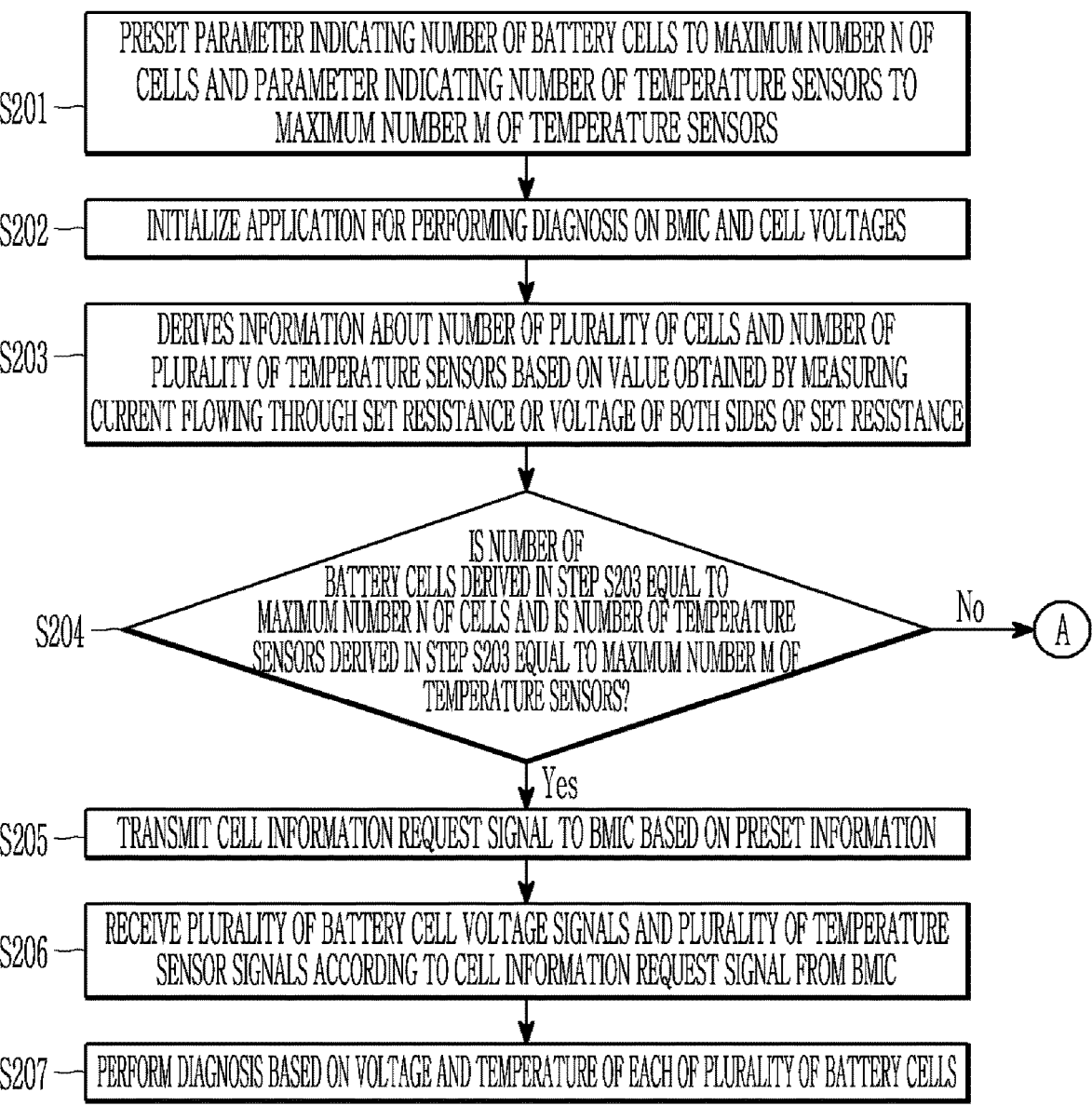

S201 — PRESET PARAMETER INDICATING NUMBER OF BATTERY CELLS TO MAXIMUM NUMBER N OF CELLS AND PARAMETER INDICATING NUMBER OF TEMPERATURE SENSORS TO MAXIMUM NUMBER M OF TEMPERATURE SENSORS

S202 — INITIALIZE APPLICATION FOR PERFORMING DIAGNOSIS ON BMIC AND CELL VOLTAGES

S203 — DERIVES INFORMATION ABOUT NUMBER OF PLURALITY OF CELLS AND NUMBER OF PLURALITY OF TEMPERATURE SENSORS BASED ON VALUE OBTAINED BY MEASURING CURRENT FLOWING THROUGH SET RESISTANCE OR VOLTAGE OF BOTH SIDES OF SET RESISTANCE

S204 — IS NUMBER OF BATTERY CELLS DERIVED IN STEP S203 EQUAL TO MAXIMUM NUMBER N OF CELLS AND IS NUMBER OF TEMPERATURE SENSORS DERIVED IN STEP S203 EQUAL TO MAXIMUM NUMBER M OF TEMPERATURE SENSORS?

No → A

Yes

S205 — TRANSMIT CELL INFORMATION REQUEST SIGNAL TO BMIC BASED ON PRESET INFORMATION

S206 — RECEIVE PLURALITY OF BATTERY CELL VOLTAGE SIGNALS AND PLURALITY OF TEMPERATURE SENSOR SIGNALS ACCORDING TO CELL INFORMATION REQUEST SIGNAL FROM BMIC

S207 — PERFORM DIAGNOSIS BASED ON VOLTAGE AND TEMPERATURE OF EACH OF PLURALITY OF BATTERY CELLS

【Figure 7】
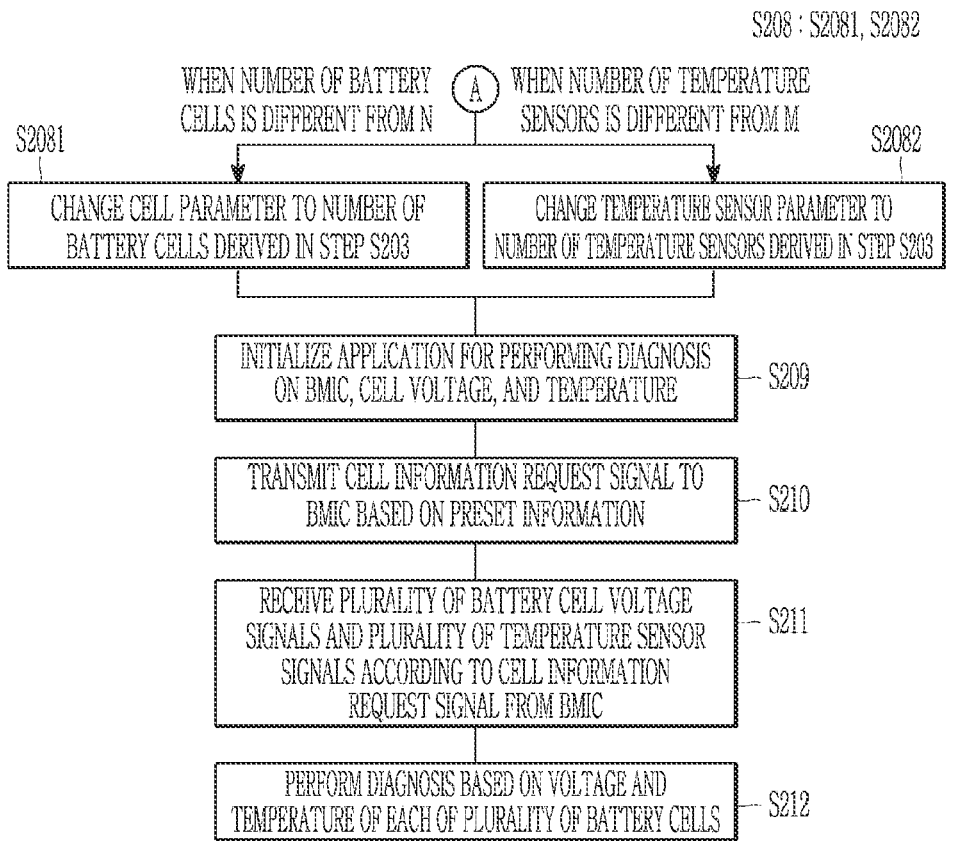

[Figure 8]
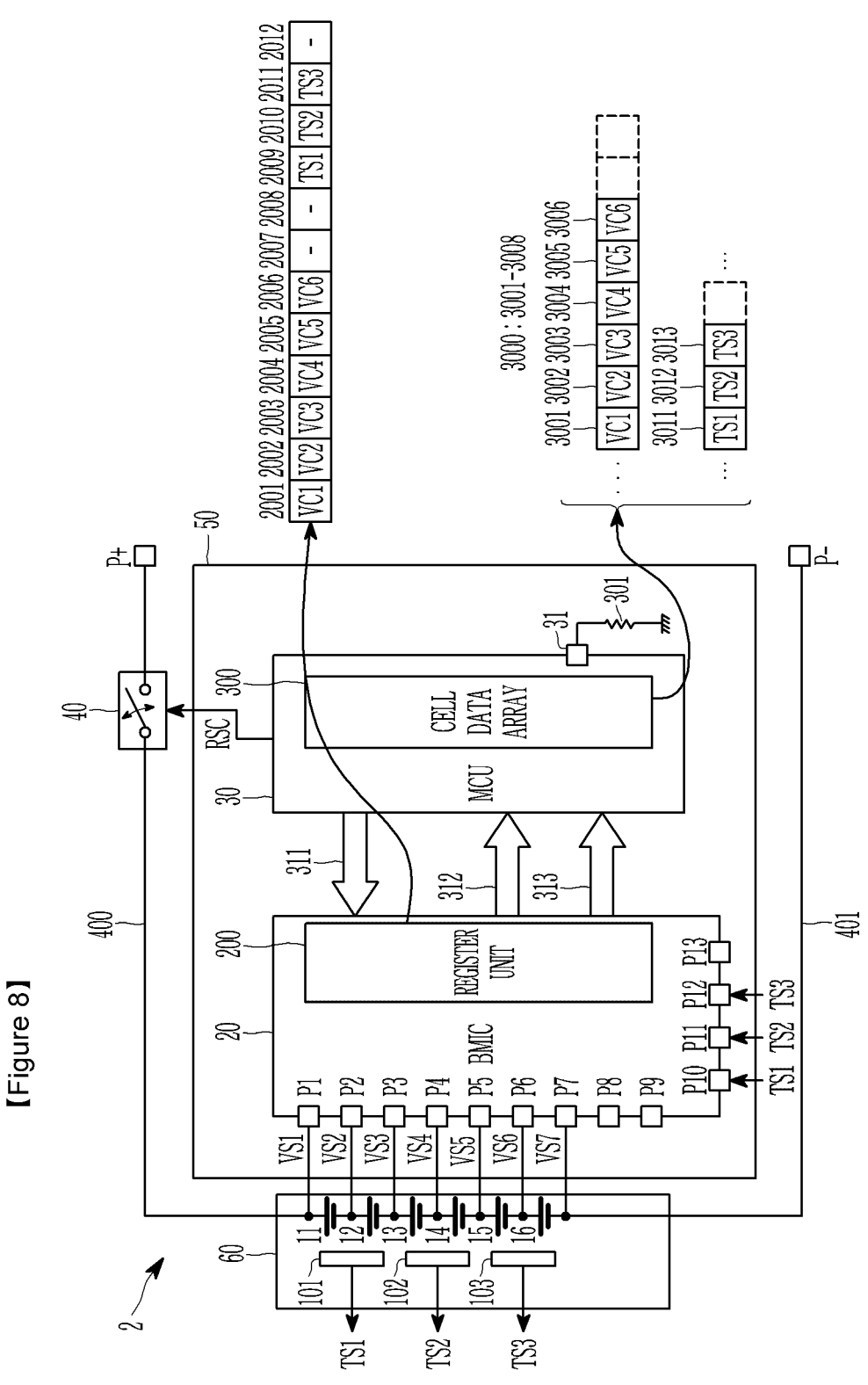

[Figure 9]
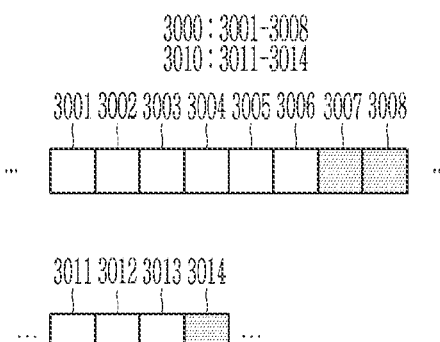

METHOD OF SETTING INFORMATION ABOUT BATTERY PACK AND BATTERY SYSTEM TO WHICH THE METHOD IS APPLIED

TECHNICAL FIELD

Cross-Reference to Related Application

This application claims priority to and the benefit of Korean Patent Application No. 10-2021-0140157 filed in the Korean Intellectual Property Office on Oct. 20, 2021, the entire contents of which are incorporated herein by reference.

The present invention relates to a method of setting information about a battery pack and a battery system to which the method is applied.

BACKGROUND ART

When software of a battery management system that monitors a plurality of battery cells is designed, the number of the plurality of battery cells is considered. When the number of the plurality of battery cells included in the monitored battery pack is changed, tasks of modifying parameters related to the number of battery cells and codes according to the number of cells and distributing software are necessary. In addition, it is necessary to distribute software of changed number by the changed number of cells.

These tasks may cause problems that require additional development time and manpower.

In addition, as the number of a plurality of temperature sensors included in the monitored battery pack is changed, there is also a need for a technology capable of responding such a change integrally.

DISCLOSURE

Technical Problem

The present invention has been made in an effort to provide a method of setting information about a battery pack according to the number of battery cells included in the battery pack in order to monitor the plurality of battery cells included in the battery pack.

An exemplary embodiment of the present invention provides a method of setting information about a battery pack according to the number of temperature sensors included in the battery pack.

Technical Solution

Another embodiment of the present invention provides a method of setting information about a battery pack including deriving, by a main control unit (MCU), information about the number of a plurality of battery cells included in a battery pack based on a set resistance value connected to an input terminal of the MCU; when the derived number of the plurality of battery cells and a set maximum number N of cells are not the same, changing, by the MCU, a cell parameter indicating the number of battery cells from the maximum number of cells to the derived number of the plurality of battery cells; transmitting, by the MCU, a cell information request signal for requesting the number of cell voltages corresponding to the cell parameter to a battery monitoring integrated circuit (BMIC) connected to the plurality of battery cells; and receiving, by the MCU, a plurality of battery cell voltage signals from the BMIC.

The method may further include, when a cell data array has a structure in which dynamic allocation is possible, dynamically allocating, by the MCU, the cell data array based on the derived number of the plurality of battery cells.

The method may further include, when the cell data array has a structure in which dynamic allocation is impossible, exceptionally processing, by the MCU, information stored in a dummy array cell that does not match the derived number of the plurality of battery cells among a plurality of array cells.

The exceptionally processing may include deriving, by the MCU, a plurality of cell voltages based on the received plurality of battery cell voltage signals, and setting one of a maximum value, a minimum value, and an average value of the plurality of cell voltages as a representative cell voltage; and storing, by the MCU, the representative cell voltage in the dummy array cell.

The exceptionally processing may include performing, by the MCU, invalid indexing on the dummy array cell and valid indexing on an array cell matching the derived number of the plurality of battery cells among the plurality of array cells.

The method may further include diagnosing, by the MCU, a state of the battery pack based on the received plurality of battery cell voltage signals.

The method may further include deriving, by the MCU, information about the number of a plurality of temperature sensors located in the battery pack including the plurality of battery cells based on the set resistance value; when the derived number of the plurality of temperature sensors and a set maximum number M of temperature sensors are not the same, changing, by the MCU, a temperature sensor parameter indicating the number of temperature sensors from the maximum number of temperature sensors to the derived number of the plurality of temperature sensors; and receiving, by the MCU, a plurality of temperature sensor signals from the BMIC, and the cell information request signal may include a request for the number of temperature sensor signals corresponding to the temperature sensor parameter.

The method may further include, when a cell data array has a structure in which dynamic allocation is possible, dynamically allocating, by the MCU, the cell data array based on the number of the plurality of battery cells and the number of the plurality of temperature sensors.

The method may further include, when the cell data array has a structure in which dynamic allocation is impossible, exceptionally processing, by the MCU, information stored in a dummy array cell that does not match the number of the plurality of battery cells and the number of the plurality of temperature sensors among a plurality of array cells.

The exceptionally processing may include deriving, by the MCU, a plurality of cell voltages based on the received plurality of battery cell voltage signals, and setting one of a maximum value, a minimum value, and an average value of the plurality of cell voltages as a representative cell voltage; deriving, by the MCU, a plurality of cell temperatures based on the received plurality of temperature sensor signals, and setting one of a maximum value, a minimum value, and an average value of the plurality of cell temperatures as a representative cell temperature; and storing, by the MCU, the representative cell voltage and the representative cell temperature in the dummy array cell.

The exceptionally processing may include performing, by the MCU, invalid indexing on the dummy array cell and valid indexing on an array cell matching the derived number of the plurality of battery cells and the number of the plurality of temperature sensors among the plurality of array cells.

The method may further include diagnosing, by the MCU, a state of the battery pack based on the received plurality of battery cell voltage signals and plurality of temperature sensor signals.

Yet another embodiment of the present invention provides a battery system including a battery monitoring integrated circuit (BMIC) connected to a plurality of battery cells to obtain a plurality of voltage measurement signals and configured to derive a plurality of battery cell voltage signals based on the plurality of voltage measurement signals; and a main control unit (MCU) configured to derive information about the number of a plurality of battery cells based on a set resistance value connected to an input terminal, when the derived number of the plurality of battery cells and a set maximum number N of cells are not the same, change a cell parameter indicating the number of battery cells from the maximum number of cells to the derived number of the plurality of battery cells, transmit a cell information request signal for requesting the number of cell voltages corresponding to the cell parameter to the BMIC, and receive the plurality of battery cell voltage signals from the BMIC.

The MCU may include a cell data array allocated to store the plurality of battery cell voltage signals received from the BMIC.

The MCU may dynamically allocate the cell data array based on the number of the plurality of battery cells when a cell data array has a structure in which dynamic allocation is possible The MCU may exceptionally process information stored in a dummy array cell that does not match the derived number of the plurality of battery cells among a plurality of array cells when the cell data array has a structure in which dynamic allocation is impossible.

The information stored in the dummy array cell may include a representative cell voltage set by the MCU, and the representative cell voltage may be set as one of a maximum value, a minimum value, and an average value of the plurality of cell voltages derived by the MCU based on the received plurality of battery cell voltage signals.

The MCU may perform invalid indexing on the dummy array cell and valid indexing on an array cell matching the number of the plurality of battery cells among the plurality of array cells.

The MCU may diagnose a state of a battery pack based on the received plurality of battery cell voltage signals.

According to an embodiment of the present invention a battery system including a battery monitoring integrated circuit (BMIC) connected to a plurality of battery cells included in a battery pack to obtain a plurality of voltage measurement signals and configured to derive a plurality of battery cell voltage signals based on the plurality of voltage measurement signals, obtain a plurality of temperature sensor signals from a plurality of temperature sensors located in a battery pack including the plurality of battery cells; and a main control unit (MCU) configured to derive information about the number of a plurality of battery cells and information about the number of a plurality of temperature sensors based on a set resistance value connected to an input terminal, when the derived number of the plurality of battery cells and a set maximum number N of cells are not the same, change a cell parameter indicating the number of battery cells from the maximum number of cells to the derived number of the plurality of battery cells, when the derived number of the plurality of temperature sensors and a set maximum number M of temperature sensors are not the same, change a temperature sensor parameter indicating the number of temperature sensors from the maximum number of temperature sensors to the derived number of the plurality of temperature sensors, transmit a cell information request signal for requesting the number of cell voltages corresponding to the cell parameter and the number of temperature sensor signals corresponding to the temperature sensor parameter to the BMIC, and receive the plurality of battery cell voltage signals and the plurality of temperature sensor signals from the BMIC.

The MCU may include a cell data array allocated to store the plurality of battery cell voltage signals and the plurality of temperature sensor signals received from the BMIC.

The MCU may dynamically allocate the cell data array based on the number of the plurality of battery cells and the number of the plurality of temperature sensors when the cell data array has a structure in which dynamic allocation is possible.

The MCU may exceptionally process information stored in a dummy array cell that does not match the derived number of the plurality of battery cells and the derived number of the plurality of temperature sensors among a plurality of array cells when the cell data array has a structure in which dynamic allocation is impossible.

The information stored in the dummy array cell may include a representative cell voltage and a representative cell temperature set by the MCU, the representative cell voltage may be set as one of a maximum value, a minimum value, and an average value of the plurality of cell voltages derived by the MCU based on the received plurality of battery cell voltage signals, and the representative cell temperature may be set as one of a maximum value, a minimum value, and an average value of the plurality of cell temperatures derived by the MCU based on the received plurality of temperature sensor signals.

The MCU may perform invalid indexing on the dummy array cell and valid indexing on an array cell matching the number of the plurality of battery cells and an array cell matching the number of the plurality of temperature sensors among the plurality of array cells.

The MCU may diagnose a state of the battery pack based on the received plurality of battery cell voltage signals and the received plurality of temperature sensor signals.

Advantageous Effects

In order to monitor the plurality of battery cells included in the battery pack, software of the battery management system may set information about the battery pack according to the number of battery cells included in the battery pack.

In addition, software of the battery management system may set information about the battery pack according to the number of temperature sensors included in the battery pack.

DESCRIPTION OF THE DRAWINGS

FIG. 1 is a diagram illustrating a battery system according to an embodiment.

FIG. 2 is a flowchart illustrating a method, performed by an MCU, of setting information about a battery pack according to an embodiment.

FIG. 3 is a diagram illustrating a battery system according to an embodiment.

FIG. 4 is a diagram schematically illustrating a cell data array when dynamic allocation is impossible in the battery system of FIG. 3.

FIG. 5 is a diagram illustrating a battery system according to an embodiment.

FIG. 6 is a flowchart illustrating a method, performed by an MCU, of setting information about a battery pack according to an embodiment.

FIG. 7 is a detailed flowchart specifically illustrating a method, performed by an MCU, of setting information about a battery pack according to an embodiment of FIG. 6.

FIG. 8 is a diagram illustrating a battery system according to an embodiment.

FIG. 9 is a diagram schematically illustrating a cell data array when dynamic allocation is impossible in the battery system of FIG. 8.

MODE FOR INVENTION

Hereinafter, the embodiments disclosed in the present specification will be described in detail with reference to the accompanying drawings, but same or similar components are given the same or similar reference numerals, and redundant descriptions thereof will be omitted. The suffixes "module" and/or "part" for components used in the following description are given or mixed in consideration of only the ease of drafting the specification, and do not have meanings or roles distinct from each other by themselves. In addition, in describing the embodiments disclosed in the present specification, when it is determined that detailed descriptions of related known technologies may obscure the gist of the embodiments disclosed in the present specification, the detailed description thereof will be omitted. In addition, the accompanying drawings are only for easy understanding of the embodiments disclosed in the present specification, do not limit the technical idea disclosed in the present specification, and should be understood to include all changes, equivalents or substitutes included in the spirit and scope of the present disclosure.

The terms including an ordinal number, such as first, second, etc., may be used to describe various components, but the components are not limited by the terms. These terms are used only for the purpose of distinguishing one component from another.

It will be further understood that the terms "comprises" and/or "comprising," when used in the present specification, specify the presence of stated features, integers, steps, operations, components, and/or parts, but do not preclude the presence or addition of one or more other features, integers, steps, operations, components, parts, and/or combinations thereof.

A program implemented as a set of instructions embodying a control algorithm necessary to control another configuration may be installed in a configuration controlling another configuration under a specific control condition among configurations according to an embodiment. The control configuration may process input data and stored data according to the installed program to generate output data. The control configuration may include a non-volatile memory to store a program and a memory to store data.

Hereinafter, a method of setting information about a battery pack according to the number of a plurality of battery cells included in the battery pack and a battery system to which the method is applied according to an embodiment will be described with reference to FIGS. 1 to 4. The method of setting information about the battery pack may be implemented as software installed in a battery management system or a program including a combination of software. The corresponding program may be stored in a storage medium of the battery management system. The storage medium may be implemented as various types of memory, such as high-speed random access memory, flash memory device, non-volatile memory such as other non-volatile solid-state memory device, etc.

FIG. 1 is a diagram illustrating a battery system according to an embodiment.

A load (not shown) such as a motor of a vehicle may be connected to output terminals (+, −) through a wiring 400 so that a battery system 1 of FIG. 1 may supply power to the load. In addition, a charger (not shown) may be connected to the output terminals (+, −) so that the battery system 1 may receive power from the charger and may be charged. The wiring 400 may be connected between a positive electrode of a battery pack 10 and the output terminal (P+), and a wiring 401 may be connected between a negative electrode of the battery pack 10 and the output terminal (P−). A relay 40 is positioned on the wiring 400 and electrically controls a current path during charging and discharging of the battery pack 10. Closing and opening of the relay 40 is controlled according to a relay control signal RSC supplied from an MCU 30. A relay may also be positioned on the wiring 401 and control the current path during charging and discharging together with the relay 40.

The battery system 1 includes the battery pack 10, a battery monitoring integrated circuit 20, the main control unit (MCU) 30, and the relay 40. Hereinafter, the battery monitoring integrated circuit is referred to as a battery monitoring integrated circuit (BMIC). Hereinafter, the main control unit is referred to as a main control unit (MCU). The BMIC 20 and the MCU 30 are mounted on a board (i.e., a circuit board) 50. In addition, although separately illustrated in FIG. 1, the relay 40, the wiring 400, and the wiring 401 may be formed on the board 50.

The battery pack 10 includes a plurality of battery cells 11 to 18 and a plurality of temperature sensors 101 to 104. FIG. 1 shows that the number of the plurality of battery cells 11 to 18 is eight, but the invention is not limited thereto, and the battery pack 10 may be implemented as two or more battery cells connected in series, a plurality of battery cells in which two or more battery cells connected in parallel are connected in series, or two or more battery cells connected in parallel. FIG. 1 shows that the number of the plurality of temperature sensors 101 to 104 is four, but the invention is not limited thereto, and the number of temperature sensors may be one or more.

The BMIC 20 is connected to each cell of the plurality of battery cells 11 to 18, and obtains a plurality of voltage measurement signals VS1 to VS9 measured from both ends of the plurality of battery cells 11 to 18 through a plurality of input terminals P1 to P9. The positive electrode of each (e.g., 11) of the plurality of battery cells 11 to 18 is connected to a corresponding input terminal (e.g., P1) among the plurality of input terminals P1 to P8 through a wiring, and the negative electrode of each of the battery cells 11 to 18 (e.g., 11) is connected to a corresponding input terminal (e.g., P2) among the plurality of input terminals P2 to P9 through a wiring. For example, the measurement signal VS1 is the positive voltage of the battery cell 11 and is input to the BMIC 20 through the input terminal P1, and the measurement signal VS2 is a voltage of the negative electrode of the battery cell 11 or a voltage of the positive electrode of the battery cell 12 and is input to the BMIC 20 through the input terminal P2.

In addition, the BMIC 20 may derive a signal representing a plurality of cell voltages for the plurality of battery cells 11 to 18 based on the plurality of voltage measurement signals VS1 to VS9. For example, the BMIC 20 may derive a cell voltage signal VC1 of the battery cell 11 based on a voltage difference between the voltage measurement signal VS1 and the voltage measurement signal VS2. The BMIC 20 may derive the same number of cell voltages as the number of battery cells 11 to 18 included in the battery pack 10. In FIG. 1, the BMIC 20 may derive the 8 battery cell voltage signals VC1 to VC8.

In addition, the BMIC 20 may receive a plurality of temperature sensor signals TS1 to TS4 determined according to the temperature sensed from each of the plurality of temperature sensors 101 to 104 through the plurality of input terminals P10 to P13.

The BMIC 20 includes a register unit 200 that may store the plurality of battery cell voltage signals VC1 to VC8 derived from the plurality of voltage measurement signals VS1 to VS9.

The register unit 200 may include a voltage register allocated by the BMIC to store the plurality of battery cell voltage signals VC1 to VC8. The voltage resistance may include a plurality of resistance cells 2001 to 2008.

The BMIC 20 may store the plurality of battery cell voltage signals VC1 to VC8 of the plurality of battery cells 11 to 18 in correspondence to the plurality of register cells 2001 to 2008.

The MCU 30 may measure a current flowing through a set resistance 301 or a voltage of both sides of the set resistance 301 through a terminal 31. The set resistance 301 is connected to the terminal 31 of the MCU 30 and can also be represented or referred to as a resistor 301 as shown in the figures. The MCU 30 may derive the number of the plurality of battery cells included in the battery pack 10 through the measured current or voltage value. The current or voltage value flowing through the set resistance 301 may vary according to the magnitude of the set resistance 301, and the MCU 30 may convert a value obtained by measuring the current or voltage value into data of a predetermined number of bits. Some of all bits may be information indicating the number of battery cells. The MCU 30 may store a table regarding the number of battery cells according to bit values.

The MCU 30 may perform charging/discharging control of the battery pack 10, cell balancing control, abnormal diagnosis, etc. based on the current flowing through the battery pack 10 together with the cell voltage signals VC1 to VC8 and the temperature measurement signals TS1 to TS4 of the plurality of battery cells 11 to 18 received from the BMIC 20. The MCU 30 may include a cell data array 300 that retrieves and stores data stored in the register unit 200.

The number of battery cells included in the battery packs 10 and 60 may vary depending on a battery pack. For example, the 8 battery cells 11 to 18 are provided in the battery pack 10 shown in FIG. 1, but the 6 battery cells 11-16 are provided in the battery pack 60 shown in FIG. 3 below. It is necessary to set information about a battery pack according to the number of a plurality of battery cells that vary depending on the battery pack. Hereinafter, a method, performed by the MCU 30, of setting information about a battery pack according to the number of a plurality of battery cells included in the battery pack and a battery system to which the method is applied will be described with reference to FIG. 2.

FIG. 2 is a flowchart illustrating a method, performed by an MCU, of setting information about a battery pack according to an embodiment.

In the MCU 30, a parameter indicating the number of battery cells is preset to a maximum number N of cells (S101). The maximum number N of cells means the maximum number of cells included in the battery pack controllable by the MCU 30. The maximum number N of cells may be 8.

The example of FIG. 1 shows that the number of input terminals for measuring a cell voltage in the BMIC 20 is nine according to the maximum number 8 of cells, and the BMIC 20 includes the 9 input terminals P1 to P9. As the maximum number of cells is changed, the number of input terminals for measuring the cell voltage in the BMIC 20 may vary.

The example of FIG. 1 shows that the number of input terminals for measuring the temperature of the battery pack 10 in the BMIC 20 is four according to the maximum number 4 of temperature sensors, and the BMIC 20 includes the 4 input terminals P10 to P13 for measuring the temperature. As the maximum number of temperature sensors is changed, the number of input terminals for measuring the temperature of the battery pack 10 in the BMIC 20 may vary.

The cell data array 300 includes a voltage data array 3000 that stores a plurality of cell voltages for monitoring cell voltages of the battery pack 10.

The MCU 30 may set the number of a plurality of array cells included in the voltage data array 3000 according to the maximum number N of cells.

Voltage register numbers allocated to store the plurality of battery cell voltage signals VC1 to VC8 in the register unit 200 may be set in the MCU 30. That is, the 8 register cells 2001 to 2008 of the register unit 200 are set in the MCU 30 as registers storing the plurality of battery cell voltage signals VC1 to VC8.

The MCU 30 may initialize an application for performing diagnosis on the BMIC 20 and the cell voltages (S102).

The MCU 30 derives information about the number of the plurality of cells based on a value obtained by measuring a current flowing through the set resistance 301 or a voltage of both sides of the set resistance 301 (S103). The MCU 30 may convert the measured value into data of a predetermined number of bits. Some of all bits may be information indicating the number of battery cells. The MCU 30 may store a table regarding the number of battery cells according to bit values.

The MCU 30 determines whether the number of battery cells derived in step S103 is equal to the maximum number N of cells (S104).

Hereinafter, when the number of battery cells is equal to N, subsequent steps S105 to S107 will be described with reference to FIG. 1. In the embodiment of FIG. 1, the number of battery cells 11 to 18 is eight.

When the number of battery cells derived in step S103 is equal to the maximum number N of cells as a result of the determination in step S104, the MCU 30 may transmit a cell information request signal to the BMIC 20 based on preset information (S105). The preset information may include voltage register numbers allocated to store the plurality of battery cell voltage signals VC1 to VC8. In FIG. 1, the cell information request signal is transmitted from the MCU 30 to the BMIC 20 through a wiring 311, but a method of transmitting and receiving a signal between the two components is not limited. The cell information request signal may include a request for the number of cell voltage signals corresponding to a cell parameter.

The MCU 30 receives the plurality of battery cell voltage signals VC1 to VC8 according to the cell information request signal from the BMIC 20 (S106).

When the BMIC 20 receives the cell information request signal from the MCU 30, the BMIC 20 transmits the plurality of battery cell voltage signals VC1 to VC8 stored in the voltage register to the MCU 30. In FIG. 1, the plurality of battery cell voltage signals VC1 to VC8 are transmitted from the BMIC 20 to the MCU 30 through a wiring 312, but a method of transmitting and receiving a signal between the two components is not limited.

The MCU 30 stores cell voltage data according to the plurality of battery cell voltage signals VC1 to VC8 received from the BMIC 20 in the plurality of array cells 3001 to 3008.

The MCU 30 performs a diagnosis based on the voltage of each of the plurality of battery cells 11 to 18 (S107). The MCU 30 may diagnose a state of the battery pack 10 based on the plurality of battery cell voltage signals received from the BMIC 20. For example, the MCU 30 may compare a plurality of battery cell voltages with a predetermined reference voltage and diagnose whether the cell is in an overvoltage state or an undervoltage state.

When the number of battery cells derived in step S103 is different from the maximum number N of cells as a result of the determination in step S104, the MCU 30 changes the cell parameter to the number of battery cells derived in step S103 (S108).

Hereinafter, when the number of battery cells is not equal to N, and the cell data array 300 has a structure in which dynamic allocation is possible, subsequent steps S108 to S111 will be described with reference to FIG. 3.

FIG. 3 is a diagram illustrating a battery system according to an embodiment.

In a battery system 2 of FIG. 3, descriptions of configurations redundant with those of the battery system 1 of FIG. 1 will be omitted.

The MCU 30 may generate a cell information request signal to include information about a register number in which a cell voltage is stored according to the number of a plurality of battery cells. The BMIC 20 may transmit information stored in the corresponding register to the MCU 30 based on the register number included in the cell information request signal.

The battery pack 60 includes the plurality of battery cells 11 to 16 and the plurality of temperature sensors 101 to 103. FIG. 3 shows that the number of the plurality of battery cells 11 to 16 is six, but the invention is not limited thereto. FIG. 3 shows that the number of the plurality of temperature sensors 101 to 103 is 3, but the invention is not limited thereto.

The BMIC 20 is connected to each cell of the plurality of battery cells 11 to 16, and obtains a plurality of voltage measurement signals VS1 to VS7 measured from both ends of the plurality of battery cells 11 to 16 through a plurality of input terminals P1 to P7. The positive electrode of each (e.g., 11) of the plurality of battery cells 11 to 16 is connected to a corresponding input terminal (e.g., P1) among the plurality of input terminals P1 to P6 through a wiring, and the negative electrode of each of the battery cells 11 to 18 (e.g., 11) is connected to a corresponding input terminal (e.g., P2) among the plurality of input terminals P2 to P7 through a wiring.

In addition, the BMIC 20 may derive a signal representing a plurality of cell voltages for the plurality of battery cells 11 to 16 based on the plurality of voltage measurement signals VS1 to VS7. In FIG. 3, the BMIC 20 may derive the 6 battery cell voltage signals VC1 to VC6.

In addition, the BMIC 20 may receive the plurality of temperature sensor signals TS1 to TS3 regarding the battery pack 60 from each of the plurality of temperature sensors 101 to 103 through the plurality of input terminals P10 to P12.

The register unit 200 may include a voltage register allocated by the BMIC to store the plurality of battery cell voltage signals VC1 to VC6. The voltage resistance may include the plurality of resistance cells 2001 to 2008.

The BMIC 20 may store the plurality of battery cell voltage signals VC1 to VC6 of the plurality of battery cells 11 to 16 in correspondence to the plurality of register cells 2001 to 2006. In FIG. 3, since the number of the resistance cells 2001 to 2008 is greater than the number of the plurality of battery cells, no cell voltage is stored in the two register cells 2007 and 2008. The BMIC 20 may not transmit the voltages stored in the two register cells 2007 and 2008 to the MCU 30. A voltage corresponding to a difference between the voltage of the input terminal P7 and the voltage of the input terminal P8 irrelevant to the cell voltage may be stored in the resistance cell 2007, and a voltage corresponding to the difference between the voltage of the input terminal P8 and the voltage of the input terminal P9 irrelevant to the cell voltage may also be stored in the resistance cell 2008. Since the voltages stored in the two register cells 2007 and 2008 are not transmitted to the MCU 30, the voltages are irrelevant to cell voltage monitoring and diagnosis.

The number of the plurality of battery cells derived from the MCU 30 is six. In the example of FIG. 3, the MCU 30 changes the cell parameter to 6.

The MCU 30 may initialize an application for performing diagnosis on the BMIC 20 and the cell voltage (S109).

The MCU 30 may change the number of array cells to store the cell voltage in the cell data array 300 according to the cell parameter when it is possible for the cell data array 300 to perform dynamic allocation. Dynamic allocation means changing the number of array cells according to a cell parameter.

The MCU 30 may dynamically allocate the number of array cells included in the voltage data array 3000 according to the number of a plurality of battery cells. For example, as shown in FIG. 3, the MCU 30 may allocate 6 to the number of array cells 3001 to 3006 to store cell voltages in the voltage data array 3000.

The MCU 30 may transmit a cell information request signal to the BMIC based on preset information (S110). The preset information may include voltage register numbers allocated to store the plurality of battery cell voltage signals VC1 to VC6. In FIG. 3, the cell information request signal is transmitted from the MCU 30 to the BMIC 20 through the wiring 311, but a method of transmitting and receiving a signal between the two components is not limited. The cell information request signal may include a request for the number of cell voltage signals corresponding to the cell parameter.

The MCU 30 receives the plurality of battery cell voltage signals VC1 to VC6 according to the cell information request signal from the BMIC 20 (S111).

When the BMIC 20 receives the cell information request signal from the MCU 30, the BMIC 20 transmits the plurality of battery cell voltage signals VC1 to VC6 stored in the voltage register to the MCU 30. In FIG. 3, the plurality of battery cell voltage signals VC1 to VC6 are transmitted from the BMIC 20 to the MCU 30 through the wiring 312, but a method of transmitting and receiving a signal between the two components is not limited.

The MCU 30 stores cell voltage data according to the plurality of battery cell voltage signals VC1 to VC6 received from the BMIC 20 in the plurality of array cells 3001 to 3006.

Hereinafter, when the number of battery cells is not equal to N, and the cell data array 300 has a structure in which dynamic allocation is impossible, steps S110 to S111 of transmitting the cell information request signal and receiving the voltage signal will be described with reference to FIG. 4.

FIG. 4 is a diagram schematically illustrating a cell data array when dynamic allocation is impossible in the battery system of FIG. 3.

As shown in FIG. 4, the MCU 30 stores the plurality of battery cell voltage signals VC1 to VC6 received from the BMIC 20 in corresponding array cells.

The MCU 30 may exceptionally process information stored in an array cell (hereinafter, referred to as a dummy array cell) that does not match the number of battery cells among a plurality of array cells. That the MCU 30 does not use the information included in the array cell for diagnosis is referred to as exceptional processing.

For example, the MCU 30 may exceptionally process information stored in the dummy array cells 3007 and 3008 of the voltage data array 3000.

The MCU 30 may transmit a cell information request signal to the BMIC based on preset information (S110). The preset information may include voltage register numbers allocated to store the plurality of battery cell voltage signals VC1 to VC6. The cell information request signal may include a request for the number of cell voltage signals corresponding to the cell parameter.

The MCU 30 receives the plurality of battery cell voltage signals VC1 to VC6 according to the cell information request signal from the BMIC 20 (S111).

In addition, when it is impossible for the cell data array 300 of the battery cells 11 to 16 to perform dynamic allocation, a representative cell value may be stored in the dummy array cells 3007 and 3008 instead of exceptional processing.

The MCU 30 may derive a representative cell voltage based on each cell voltage of the plurality of battery cells 11 to 16 and store the representative cell voltage in the dummy array cells 3007 and 3008. As a method of deriving the representative cell voltage, a method of deriving a maximum value, a minimum value, an average value, etc. may be used. For example, during charging of the battery pack 60, the maximum value among the cell voltages of the plurality of battery cells 11 to 16 may be the representative cell voltage.

The MCU 30 performs a diagnosis based on the voltage of each of the plurality of battery cells 11 to 16 (S112).

The MCU 30 may diagnose a state of the battery pack 60 based on the plurality of battery cell voltage signals VC1 to VC6 received from the BMIC 20. For example, the MCU 30 may compare the plurality of battery cell voltage signals VC1 to VC6 with a predetermined reference voltage and diagnose whether the cell is in an overvoltage state or an undervoltage state.

When dynamic allocation is impossible, the MCU 30 may perform valid or invalid indexing on an array cell so that information stored in the array cell is not reflected in the diagnosis, and may not use information of the invalid indexed array cell during diagnosis. For example, according to the number of cells, the array cells 3001 to 3006 may be indexed as valid, and the dummy array cells 3007 and 3008 may be indexed as invalid.

The number of the plurality of temperature sensors provided in the battery packs 10 and 60 may also vary depending on the battery pack. For example, the battery pack 10 shown in FIG. 1 includes the 4 temperature sensors 101 to 104, but the battery pack 60 shown in FIG. 3 includes the three temperature sensors 101 to 103. In FIG. 1, the plurality of voltage measurement signals VS1 to VS9 are input to the BMIC 20 through the plurality of input terminals P1 to P9, and in FIG. 3, the plurality of voltage measurement signals VS1 to VS7 are input to the BMIC 20 through the plurality of input terminals P1 to P7. As such, because not only the number of cells but also the number of temperature sensors vary depending on the battery pack, it is necessary to set information about the battery pack according to the number of the plurality of temperature sensors.

Hereinafter, a method of setting information about a battery pack according to the number of a plurality of battery cells and the number of a plurality of temperature sensors included in the battery pack and a battery system to which the method is applied according to an embodiment will be described with reference to FIGS. 5 to 9. In FIGS. 5 and 8, descriptions of configurations redundant with those shown in FIGS. 1 and 3 will be omitted.

FIG. 5 is a diagram illustrating a battery system according to an embodiment.

The BMIC 20 may receive the plurality of temperature sensor signals TS1 to TS4 regarding the battery pack 10 from each of the plurality of temperature sensors 101 to 104 through the plurality of input terminals P10 to P13.

The BMIC 20 includes the register unit 200 that may store the plurality of battery cell voltage signals VC1 to VC8 and the plurality of temperature sensor signals TS1 to TS4 derived from the plurality of voltage measurement signals VS1 to VS9.

The register unit 200 may include a voltage register allocated by the BMIC to store the plurality of battery cell voltage signals VC1-VC8 and a temperature register allocated by the BMIC 20 to store the plurality of temperature sensor signals TS1 to TS4. The voltage resistance may include the plurality of resistance cells 2001 to 2008, and the temperature register may include a plurality of resistance cells 2009 to 2012.

The BMIC 20 may store the plurality of battery cell voltage signals VC1 to VC8 of the plurality of battery cells 11 to 18 in correspondence to the plurality of register cells 2001 to 2008. In addition, the BMIC 20 may store the plurality of temperature sensor signals TS1 to TS4 corresponding to the plurality of resistance cells 2009 to 2012.

The MCU 30 may measure a current flowing through the set resistance 301 or a voltage of both sides of the set resistance 301 through the terminal 31. The set resistance 301 is connected to the terminal 31 of the MCU 30. The MCU may derive the number of the plurality of battery cells and the number of temperature sensors included in the battery pack 10 through the measured current or voltage value. The current or voltage value flowing through the set resistance 301 may vary according to the magnitude of the set resistance 301, and the MCU 30 may convert a value obtained by measuring the current or voltage value into data of a predetermined number of bits. Some of all bits may be information indicating the number of battery cells, and others of all bits may be information indicating the number of temperature sensors. The MCU 30 may store a table regarding the number of battery cells according to bit values and a table regarding the number of temperature sensors according to bit values.

The MCU 30 may perform charging/discharging control of the battery pack 10, cell balancing control, abnormal diagnosis, etc. based on the current flowing through the battery pack 10 together with the cell voltage signals VC1 to VC8 and the temperature measurement signals TS1 to TS4 of the plurality of battery cells 11 to 18 received from the BMIC 20. The MCU 30 may include the cell data array 300 that retrieves and stores data stored in the register unit 200.

Hereinafter, a method, performed by the MCU 30, of setting information about the battery pack according to the number of a plurality of battery cells included in the battery pack 10 and the number of a plurality of temperature sensors included in the battery pack 10 and a battery system to which the method is applied according to an embodiment will be described with reference to FIG. 6.

FIG. 6 is a flowchart illustrating a method, performed by an MCU, of setting information about a battery pack according to an embodiment.

In the MCU 30, a parameter indicating the number of battery cells is preset to a maximum number N of cells and a parameter indicating the number of temperature sensors is preset to a maximum number M of temperature sensors (S201). The maximum number N of cells means the maximum number of cells included in the battery pack controllable by the MCU 30. The maximum number N of cells may be 8. The maximum number M of temperature sensors means the maximum number of temperature sensors included in the battery pack controllable by the MCU 30. The maximum number M of temperature sensors may be 4.

The example of FIG. 5 shows that the number of input terminals for measuring a cell voltage in the BMIC 20 is nine according to the maximum number 8 of cells, and the BMIC 20 includes the 9 input terminals P1 to P9. As the maximum number of cells is changed, the number of input terminals for measuring the cell voltage in the BMIC 20 may vary.

The example of FIG. 5 shows that the number of input terminals for measuring the temperature of the battery pack 10 in the BMIC 20 is four according to the maximum number 4 of temperature sensors, and the BMIC 20 includes the 4 input terminals P10 to P13. As the maximum number of temperature sensors is changed, the number of input terminals for measuring the temperature of the battery pack 10 in the BMIC 20 may vary.

The cell data array 300 includes a voltage data array 3000 that stores a plurality of cell voltages for monitoring cell voltages of the battery pack 10, and a temperature data array 3010 storing a plurality of temperature sensor signals for monitoring the cell temperature of the battery pack 10.

The MCU 30 may set the number of a plurality of array cells included in the voltage data array 3000 according to the maximum number N of cells. The MCU 30 may set the number of a plurality of array cells included in the temperature data array 3010 according to the maximum number M of temperature sensors.

Voltage register numbers allocated to store the plurality of battery cell voltage signals VC1 to VC8 and temperature register numbers allocated to store the plurality of temperature sensor signals TS1 to TS4 in the register unit 200 may be set in the MCU 30. That is, the 8 register cells 2001 to 2008 of the register unit 200 are set in the MCU 30 as registers storing the plurality of battery cell voltage signals VC1 to VC8, and the 4 register cells 2009 to 2012 of the register unit 200 are set in the MCU 30 as registers storing the plurality of temperature sensor signals TS1 to TS4.

The MCU 30 may initialize an application for performing diagnosis on the BMIC 20 and the cell voltages (S202).

The MCU 30 derives information about the number of the plurality of cells based on a value obtained by measuring a current flowing through the set resistance 301 or a voltage of both sides of the set resistance 301 (S203). The MCU 30 may convert the measured value into data of a predetermined number of bits. Some of all bits may be information indicating the number of battery cells, and others of all bits may be information indicating the number of temperature sensors. The MCU 30 may store a table regarding the number of battery cells according to bit values, and a table regarding the number of temperature sensors according to bit values.

The MCU 30 determines whether the number of battery cells derived in step S203 is equal to the maximum number N of cells and whether the number of temperature sensors derived in step S203 is equal to the maximum number M of temperature sensors (S204).

Hereinafter, when the number of battery cells is equal to N, and the number of temperature sensors is equal to M, subsequent steps S205 to S206 will be described with reference to FIG. 5. In the embodiment of FIG. 5, the number of battery cells 11 to 18 is eight, and the number of temperature sensors 101 to 104 is four.

When the number of battery cells derived in step S203 is equal to the maximum number N of cells and the number of temperature sensors is equal to M derived in step S203 as a result of the determination in step S204, the MCU may transmit a cell information request signal to the BMIC 20 based on preset information (S205). The preset information may include voltage register numbers allocated to store the plurality of battery cell voltage signals VC1 to VC8, and temperature register numbers allocated to store the plurality of temperature sensor signals TS1 to TS4. In FIG. 5, the cell information request signal is transmitted from the MCU 30 to the BMIC 20 through the wiring 311, but a method of transmitting and receiving a signal between the two components is not limited. The cell information request signal may include a request for the number of cell voltage signals corresponding to the cell parameter. The cell information request signal may include a request for the number of temperature sensor signals corresponding to the temperature sensor parameter.

The MCU 30 receives the plurality of battery cell voltage signals VC1 to VC8 and the plurality of temperature sensor signals TS1 to TS4 according to the cell information request signal from the BMIC 20 (S206).

When the BMIC 20 receives the cell information request signal from the MCU 30, the BMIC 20 transmits the plurality of battery cell voltage signals VC1 to VC8 stored in the voltage register and the plurality of temperature sensor signals TS1 to TS4 stored in the temperature register to the MCU 30. In FIG. 5, the plurality of battery cell voltage signals VC1 to VC8 are transmitted from the BMIC 20 to the MCU 30 through the wiring 312, and the plurality of temperature sensor signals TS1 to TS4 are transmitted from the BMIC 20 to the MCU 30 through a wiring 313, but a method of transmitting and receiving a signal between the two components is not limited.

The MCU 30 stores cell voltage data according to the plurality of battery cell voltage signals VC1 to VC8 and temperature data according to the plurality of temperature sensor signals TS1 to TS4 received from the BMIC 20 in the plurality of array cells 3001 to 3008 and 3011 to 3014. For example, the MCU may store the plurality of battery cell voltage signals VC1 to VC8 in the plurality of array cells 3001 to 3008, and the MCU 30 may store the plurality of temperature sensor signals TS1 to TS4 in the plurality of array cells 3011 to 3014.

The MCU 30 performs a diagnosis based on the voltage and temperature of each of the plurality of battery cells 11 to 18 (S207). The MCU 30 may diagnose a state of the battery pack 10 based on the plurality of battery cell voltage signals and the plurality of temperature sensor signals received from the BMIC 20. For example, the MCU 30 may compare a plurality of battery cell voltages with a predetermined reference voltage and diagnose whether the cell is in an overvoltage state or an undervoltage state, and the MCU 30 may estimate the temperature of the battery pack 10 or estimate the temperature of each of the plurality of battery cells 11 to 18 based on the plurality of temperature sensor signals TS1 to TS4, and may diagnose whether the estimated temperature is in a high temperature state higher than a predetermined reference temperature.

The MCU 30 compares the number of battery cells derived in step S203 and the maximum number N of cells with each other, compares the number of temperature sensors derived in step S203 and the maximum number M of temperature sensors with each other (S204), and, when at least one of comparisons is different, subsequent steps S208 to S212 shown in FIG. 7 proceed.

Hereinafter, when the number of battery cells and the maximum number N of cells derived in step S203 are compared with each other, the number of temperature sensors and the maximum number M of temperature sensors derived in step S203 are compared with each other (S204), and at least one of comparisons is different, subsequent steps S208 to S211 will be described with reference to FIG. 7.

FIG. 7 is a detailed flowchart specifically illustrating a method, performed by an MCU, of setting information about a battery pack according to an embodiment of FIG. 6.

When the number of battery cells derived in step S203 is different from the maximum number N of cells, or the number of temperature sensors derived in step S203 is different from the maximum number M of temperature sensors, or both are different, the MCU 30 changes the corresponding parameter among the cell parameter and the temperature sensor parameter to the number derived in step S203 (S208). Step S208 may include step S2081 and/or step S2082.

When the number of battery cells derived in step S203 is different from the maximum number N of cells, the MCU 30 changes the cell parameter to the number of battery cells derived in step S203 (S2081). In addition, when the number of temperature sensors derived in step S203 is different from the maximum number M of temperature sensors, the MCU 30 changes the temperature sensor parameter to the number of temperature sensors derived in step S203 (S2082). When both steps S2081 and S2082 are performed, the two steps may be performed sequentially, in the reverse order, or simultaneously.

Hereinafter, when at least one of the cell parameter and the temperature sensor parameter is changed to the number derived in step S203, and the cell data array 300 has a structure in which dynamic allocation is possible, subsequent steps S208 to S211 will be described with reference to FIG. 8.

FIG. 8 is a diagram illustrating a battery system according to an embodiment.

In the battery system 2 of FIG. 8, descriptions of configurations redundant with those of the battery system 1 of FIG. 5 will be omitted.

The MCU 30 may generate a cell information request signal to include information about a register number in which a cell voltage is stored and a register number in which a cell temperature measurement signal is stored according to the number of the plurality of battery cells and the number of the plurality of temperature sensors. The BMIC 20 may transmit information stored in the corresponding register to the MCU 30 based on the register number included in the cell information request signal.

The battery pack 60 includes the plurality of battery cells 11 to 16 and the plurality of temperature sensors 101 to 103.

FIG. 8 shows that the number of the plurality of battery cells 11 to 16 is six, but the invention is not limited thereto. FIG. 8 shows that the number of the plurality of temperature sensors 101 to 103 is 3, but the invention is not limited thereto.

The BMIC 20 is connected to each cell of the plurality of battery cells 11 to 16, and obtains a plurality of voltage measurement signals VS1 to VS7 measured from both ends of the plurality of battery cells 11 to 16 through a plurality of input terminals P1 to P7. The positive electrode of each (e.g., 11) of the plurality of battery cells 11 to 16 is connected to a corresponding input terminal (e.g., P1) among the plurality of input terminals P1 to P6 through a wiring, and the negative electrode of each of the battery cells 11 to 18 (e.g., 11) is connected to a corresponding input terminal (e.g., P2) among the plurality of input terminals P2 to P7 through a wiring.

In addition, the BMIC 20 may derive a signal representing a plurality of cell voltages for the plurality of battery cells 11 to 16 based on a difference in the voltage between the input terminals P1 to P7 respectively derived from the plurality of voltage measurement signals VS1 to VS7. In FIG. 3, the BMIC 20 may derive the 6 battery cell voltage signals VC1 to VC6.

In addition, the BMIC 20 may receive the plurality of temperature sensor signals TS1 to TS3 regarding the battery pack 60 from each of the plurality of temperature sensors 101 to 103 through the plurality of input terminals P10 to P12.

The register unit 200 may include a voltage register allocated by the BMIC to store the plurality of battery cell voltage signals VC1-VC6 and a temperature register allocated by the BMIC 20 to store the plurality of temperature sensor signals TS1 to TS3. The voltage resistance may include the plurality of resistance cells 2001 to 2008, and the temperature register may include the plurality of resistance cells 2009 to 2012.

The BMIC 20 may store the plurality of battery cell voltage signals VC1 to VC6 of the plurality of battery cells 11 to 16 in correspondence to the plurality of register cells 2001 to 2006. In FIG. 8, since the number of the resistance cells 2001 to 2008 is greater than the number of the plurality of battery cells, no cell voltage is stored in the two register cells 2007 and 2008. The BMIC 20 may not transmit the voltages stored in the two register cells 2007 and 2008 to the MCU 30. A voltage corresponding to a difference between the voltage of the input terminal P7 and the voltage of the input terminal P8 irrelevant to the cell voltage may be stored in the resistance cell 2007, and a voltage corresponding to the difference between the voltage of the input terminal P8 and the voltage of the input terminal P9 irrelevant to the cell voltage may also be stored in the resistance cell 2008. Since the voltages stored in the two register cells 2007 and 2008 are not transmitted to the MCU 30, the voltages are irrelevant to cell voltage monitoring and diagnosis.

In addition, the BMIC 20 may store the plurality of temperature sensor signals TS1 to TS3 corresponding to the plurality of resistance cells 2009 to 2011. In FIG. 8, since the number of the resistance cells 2009 to 2012 is greater than the number of the plurality of temperature sensors, no temperature sensor is stored in the register cell 2012. The BMIC 20 does not transmit the voltage stored in the register cell 2012 to the MCU 30. The signal stored in the register cell 2012 may be a signal supplied through the input terminal P13. Since the signal stored in the register cell 2012 is not transmitted to the MCU 30, the voltage is irrelevant to cell temperature monitoring and diagnosis.

The number of the plurality of battery cells and the number of the plurality of temperature sensors derived from the MCU 30 are 6 and 3, respectively. In the example of FIG. 8, the MCU 30 changes the cell parameter to 6 and the temperature sensor parameter to 3.

The MCU 30 may initialize an application for performing diagnosis on the BMIC 20 and the cell voltage and temperature (S209).

The MCU 30 may change the number of array cells to store the cell voltage in the cell data array 300 according to the cell parameter and change the number of array cells to store the temperature sensor signals according to the temperature sensor parameter when it is possible for the cell data array 300 to perform dynamic allocation. Dynamic allocation means changing the number of array cells according to a cell parameter and a temperature sensor parameter.

The MCU 30 may dynamically allocate the number of array cells included in the voltage data array 3000 according to the number of a plurality of battery cells. For example, as shown in FIG. 3, the MCU 30 may allocate 6 to the number of array cells 3001 to 3006 to store cell voltages in the voltage data array 3000.

In addition, the MCU 30 may dynamically allocate the number of array cells included in the temperature data array 3010 according to the number of the plurality of temperature sensors. For example, as shown in FIG. 8, the MCU 30 may allocate 3 to the array cells 3011 to 3013 to store temperature sensor signals in the temperature data array 3010.

The MCU 30 may transmit a cell information request signal to the BMIC based on preset information (S210). The preset information may include voltage register numbers allocated to store the plurality of battery cell voltage signals VC1 to VC6, and temperature register numbers allocated to store the plurality of temperature sensor signals TS1 to TS3. In FIG. 8, the cell information request signal is transmitted from the MCU 30 to the BMIC 20 through the wiring 311, but a method of transmitting and receiving a signal between the two components is not limited. The cell information request signal may include a request for the number of cell voltage signals corresponding to the cell parameter and a request for the number of temperature sensor signals corresponding to the temperature sensor parameter.

The MCU 30 receives the plurality of battery cell voltage signals VC1 to VC6 and the plurality of temperature sensor signals TS1 to TS3 according to the cell information request signal from the BMIC 20 (S211).

When the BMIC 20 receives the cell information request signal from the MCU 30, the BMIC 20 transmits the plurality of battery cell voltage signals VC1 to VC6 stored in the voltage register and the plurality of temperature sensor signals TS1 to TS3 stored in the temperature register to the MCU 30. In FIG. 8, the plurality of battery cell voltage signals VC1 to VC6 are transmitted from the BMIC 20 to the MCU 30 through the wiring 312, and the plurality of temperature sensor signals TS1 to TS3 are transmitted from the BMIC 20 to the MCU 30 through the wiring 313, but a method of transmitting and receiving a signal between the two components is not limited.

The MCU 30 stores cell voltage data according to the plurality of battery cell voltage signals VC1 to VC6 and temperature data according to the plurality of temperature sensor signals TS1 to TS3 received from the BMIC 20 in the plurality of array cells 3001 to 3006 and 3011 to 3013. For example, the MCU may store the plurality of battery cell voltage signals VC1 to VC6 in the plurality of array cells

3001 to 3006, and the MCU 30 may store the plurality of temperature sensor signals TS1 to TS3 in the plurality of array cells 3011 to 3013.

Hereinafter, when the number of battery cells is not equal to N, and the cell data array 300 has a structure in which dynamic allocation is impossible, steps S210 to S211 of transmitting the cell information request signal and receiving the voltage signal will be described with reference to FIG. 9.

FIG. 9 is a diagram schematically illustrating a cell data array when dynamic allocation is impossible in the battery system of FIG. 8.

As shown in FIG. 9, the MCU 30 stores the plurality of battery cell voltage signals VC1 to VC6 and the plurality of temperature sensor signals TS1 to TS3 received from the BMIC 20 in corresponding array cells.

The MCU 30 may exceptionally process information stored in an array cell (hereinafter, referred to as a dummy array cell) that does not match the number of battery cells and the number of temperature sensors among a plurality of array cells. That the MCU 30 does not use the information included in the array cell for diagnosis is referred to as exceptional processing.

For example, the MCU 30 may exceptionally process information stored in the dummy array cells 3007 and 3008 of the voltage data array 3000. The MCU 30 may exceptionally process information stored in the dummy array cell 3014 of the temperature data array 3010.

The MCU 30 may transmit a cell information request signal to the BMIC based on preset information (S210). The preset information may include voltage register numbers allocated to store the plurality of battery cell voltage signals VC1 to VC6, and temperature register numbers allocated to store the plurality of temperature sensor signals TS1 to TS3. The cell information request signal may include a request for the number of cell voltage signals corresponding to the cell parameter. The cell information request signal may include a request for the number of temperature sensor signals corresponding to the temperature sensor parameter.

The MCU 30 receives the plurality of battery cell voltage signals VC1 to VC6 and the plurality of temperature sensor signals TS1 to TS3 according to the cell information request signal from the BMIC 20 (S211).

In addition, when it is impossible for the cell data array 300 of the battery cells 11 to 16 to perform dynamic allocation, a representative cell value may be stored in the dummy array cells 3007, 3008, and 3014 instead of exceptional processing.

The MCU 30 may derive a representative cell voltage based on each cell voltage of the plurality of battery cells 11 to 16 and store the representative cell voltage in the dummy array cells 3007 and 3008. As a method of deriving the representative cell voltage, a method of deriving a maximum value, a minimum value, an average value, etc. may be used. For example, during charging of the battery pack 60, the maximum value among the cell voltages of the plurality of battery cells 11 to 16 may be the representative cell voltage.

The MCU 30 may derive a representative cell temperature based on the temperature sensor signals TS1 to TS3 of the plurality of battery cells 11 to 16 and store the representative cell temperature in the dummy array cell 3014. As a method of deriving the representative cell temperature, a method of deriving a maximum value, a minimum value, an average value, etc. may be used. For example, during charging of the battery pack 10, an average value among the cell temperatures of the plurality of battery cells 11 to 16 may be the representative cell temperature.

The MCU 30 performs a diagnosis based on the voltage and temperature of each of the plurality of battery cells 11 to 16 (S212).

The MCU 30 may diagnose a state of the battery pack 60 based on the plurality of battery cell voltage signals VC1 to VC6 and the plurality of temperature sensor signals TS1 to TS3 received from the BMIC 20. For example, the MCU may compare a plurality of battery cell voltage signals VC1 to VC6 with a predetermined reference voltage and diagnose whether the cell is in an overvoltage state or an undervoltage state, and the MCU 30 may estimate the temperature of the battery pack 60 or estimate the temperature of each of the plurality of battery cells 11 to 16 based on the plurality of temperature sensor signals TS1 to TS3, and may diagnose whether the estimated temperature is in a high temperature state higher than a predetermined reference temperature.

When dynamic allocation is impossible, the MCU 30 may perform valid or invalid indexing on an array cell so that information stored in the array cell is not reflected in the diagnosis, and may not use information of the invalid indexed array cell during diagnosis. For example, according to the number of cells and the number of temperature sensors, the array cells 3001 to 3006 and 3011 to 3013 may be indexed as valid, and the dummy array cells 3007, 3008, and 3014 may be indexed as invalid.

Although the embodiments of the present invention have been described in detail above, the scope of the present invention is not limited thereto, and various modifications and improvements made by a person of an ordinary skill in the field to which the present invention pertains also belong to the scope of the present invention.

The invention claimed is:

1. A method of setting information about a battery pack, the method comprising:
deriving, by a main control unit (MCU), information about a number of a plurality of battery cells included in the battery pack based on a set resistance value, the set resistance value being set by a set resistance of a resistor connected to an input terminal of the MCU;
when the derived number of the plurality of battery cells and a set maximum number of cells are not the same, changing, by the MCU, a cell parameter indicating the number of the plurality of battery cells from the maximum number of cells to the derived number of the plurality of battery cells;
transmitting, by the MCU, a cell information request signal for requesting a number of cell voltages corresponding to the cell parameter to a battery monitoring integrated circuit (BMIC) connected to the plurality of battery cells; and
receiving, by the MCU, a plurality of battery cell voltage signals from the BMIC.

2. The method of claim 1, further comprising:
when a cell data array has a structure in which dynamic allocation is possible, dynamically allocating, by the MCU, the cell data array based on the derived number of the plurality of battery cells.

3. The method of claim 2, further comprising:
when the cell data array has a structure in which dynamic allocation is impossible, exceptionally processing, by the MCU, information stored in a dummy array cell that does not match the derived number of the plurality of battery cells among a plurality of array cells.

4. The method of claim 3, wherein:
the exceptionally processing includes:
deriving, by the MCU, a plurality of cell voltages based on the received plurality of battery cell voltage signals, and setting one of a maximum value, a minimum value, and an average value of the plurality of cell voltages as a representative cell voltage; and
storing, by the MCU, the representative cell voltage in the dummy array cell.

5. The method of claim 3, wherein:
the exceptionally processing includes:
performing, by the MCU, invalid indexing on the dummy array cell and valid indexing on an array cell matching the derived number of the plurality of battery cells among the plurality of array cells.

6. The method of claim 1, further comprising:
diagnosing, by the MCU, a state of the battery pack based on the received plurality of battery cell voltage signals.

7. The method of claim 1, further comprising:
deriving, by the MCU, information about a number of a plurality of temperature sensors located in the battery pack including the plurality of battery cells based on the set resistance value;
when the derived number of the plurality of temperature sensors and a set maximum number of temperature sensors are not the same, changing, by the MCU, a temperature sensor parameter indicating the number of temperature sensors from the maximum number of temperature sensors to the derived number of the plurality of temperature sensors; and
receiving, by the MCU, a plurality of temperature sensor signals from the BMIC, wherein the cell information request signal includes a request for a number of temperature sensor signals corresponding to the temperature sensor parameter.

8. The method of claim 7, further comprising:
when a cell data array has a structure in which dynamic allocation is possible, dynamically allocating, by the MCU, the cell data array based on the number of the plurality of battery cells and the number of the plurality of temperature sensors.

9. The method of claim 7, further comprising:
when the cell data array has a structure in which dynamic allocation is impossible, exceptionally processing, by the MCU, information stored in a dummy array cell that does not match the number of the plurality of battery cells and the number of the plurality of temperature sensors among a plurality of array cells.

10. The method of claim 9, wherein:
the exceptionally processing includes:
deriving, by the MCU, a plurality of cell voltages based on the received plurality of battery cell voltage signals, and setting one of a maximum value, a minimum value, and an average value of the plurality of cell voltages as a representative cell voltage;
deriving, by the MCU, a plurality of cell temperatures based on the received plurality of temperature sensor signals, and setting one of a maximum value, a minimum value, and an average value of the plurality of cell temperatures as a representative cell temperature; and
storing, by the MCU, the representative cell voltage and the representative cell temperature in the dummy array cell.

11. The method of claim 9, wherein:
the exceptionally processing includes:
performing, by the MCU, invalid indexing on the dummy array cell and valid indexing on an array cell matching the derived number of the plurality of battery cells and the number of the plurality of temperature sensors among the plurality of array cells.

12. The method of claim 7, further comprising:

diagnosing, by the MCU, a state of the battery pack based on the received plurality of battery cell voltage signals and plurality of temperature sensor signals.

13. A battery system comprising:

a battery monitoring integrated circuit (BMIC) connected to a plurality of battery cells included in a battery pack to obtain a plurality of voltage measurement signals and configured to derive a plurality of battery cell voltage signals based on the plurality of voltage measurement signals; and a main control unit (MCU) configured to:

derive information about a number of the plurality of battery cells based on a set resistance value, the set resistance value being set by a set resistance of a resistor connected to an input terminal, when the derived number of the plurality of battery cells and a set maximum number of cells are not the same, change a cell parameter indicating the number of the plurality of battery cells from the maximum number of cells to the derived number of the plurality of battery cells, transmit a cell information request signal for requesting a number of cell voltages corresponding to the cell parameter to the BMIC, and receive the plurality of battery cell voltage signals from the BMIC.

14. The battery system of claim 13, wherein:

the MCU includes a cell data array allocated to store the plurality of battery cell voltage signals received from the BMIC.

15. The battery system of claim 14, wherein:

the MCU dynamically allocates the cell data array based on the number of the plurality of battery cells when the cell data array has a structure in which dynamic allocation is possible.

16. The battery system of claim 14, wherein:

the MCU exceptionally processes information stored in a dummy array cell that does not match the derived number of the plurality of battery cells among a plurality of array cells when the cell data array has a structure in which dynamic allocation is impossible.

17. The battery system of claim 16, wherein:

the information stored in the dummy array cell includes:

a representative cell voltage set by the MCU; and the representative cell voltage is set as one of a maximum value, a minimum value, and an average value of the cell voltages derived by the MCU based on the received plurality of battery cell voltage signals.

18. The battery system of claim 16, wherein:

the MCU performs invalid indexing on the dummy array cell and valid indexing on an array cell matching the number of the plurality of battery cells among the plurality of array cells.

19. The battery system of claim 13, wherein:

the MCU diagnoses a state of the battery pack based on the received plurality of battery cell voltage signals.

20. A battery system comprising:

a battery monitoring integrated circuit (BMIC) connected to a plurality of battery cells of a battery pack to obtain a plurality of voltage measurement signals and configured to derive a plurality of battery cell voltage signals based on the plurality of voltage measurement signals, obtain a plurality of temperature sensor signals from a plurality of temperature sensors located in the battery pack including the plurality of battery cells; and a main control unit (MCU) configured to:

derive information about a number of the plurality of battery cells and information about a number of the plurality of temperature sensors based on a set resistance value, the set resistance value being set by a set resistance of a resistor connected to an input terminal, when the derived number of the plurality of battery cells and a set maximum number of cells are not the same, change a cell parameter indicating the number of the plurality of battery cells from the maximum number of cells to the derived number of the plurality of battery cells, when the derived number of the plurality of temperature sensors and a set maximum number of temperature sensors are not the same, change a temperature sensor parameter indicating the number of the plurality of temperature sensors from the maximum number of temperature sensors to the derived number of the plurality of temperature sensors, transmit a cell information request signal for requesting a number of cell voltages corresponding to the cell parameter and a number of temperature sensor signals corresponding to the temperature sensor parameter to the BMIC, and receive the plurality of battery cell voltage signals and the plurality of temperature sensor signals from the BMIC.

* * * * *